US010270345B1

(12) United States Patent
Kotikalapoodi (10) Patent No.: US 10,270,345 B1
(45) Date of Patent: Apr. 23, 2019

(54) METHOD AND APPARATUS FOR WIDE BANDWIDTH, EFFICIENT POWER SUPPLY

(71) Applicant: Sridhar Kotikalapoodi, Sunnyvale, CA (US)

(72) Inventor: Sridhar Kotikalapoodi, Sunnyvale, CA (US)

( * ) Notice: Subject to any disclaimer, the term of this patent is extended or adjusted under 35 U.S.C. 154(b) by 0 days.

(21) Appl. No.: 15/657,180

(22) Filed: Jul. 23, 2017

Related U.S. Application Data (62) Division of application No. 14/070,502, filed on Nov. 2, 2013, now Pat. No. 9,748,845.

(51) Int. Cl.
*H03F 1/02* (2006.01)
*H02M 3/158* (2006.01)

(52) U.S. Cl.
CPC ........ *H02M 3/1584* (2013.01); *H03F 1/0222* (2013.01)

(58) Field of Classification Search
CPC .................................... H02M 3/1584
See application file for complete search history.

(56) References Cited

U.S. PATENT DOCUMENTS

| 5,258,701 | A | 11/1993 | Pizzi |
| 7,292,015 | B2 | 11/2007 | Oswald |
| 2009/0278517 | A1 | 11/2009 | Kleveland |
| 2010/0123443 | A1 | 5/2010 | Grimm |
| 2015/0048883 | A1* | 2/2015 | Vinayak ................ H02M 3/06 330/127 |

FOREIGN PATENT DOCUMENTS

JP WO2008010062 A1 1/2008

OTHER PUBLICATIONS

Amos et al., Newnes Dictionary of Electronics, 1999, Fourth Edition, p. 227.
IEEE 100 the Authoritative Dictionary of IEEE Standard Terms, 7th Edition, 2000, ISBN 0-7381-2601-2, pp. 791-792.
Modern Dictionary of Electronics, 7th Edition, Rudolf F. Graf,1999, ISBN 0-7506-9866-7, pp. 537-538.

* cited by examiner

*Primary Examiner* — Daniel J Cavallari
(74) *Attorney, Agent, or Firm* — Heimlich Law, PC; Alan Heimlich, Esq.

(57) ABSTRACT

An efficient power supply with fast, wideband response has been disclosed. In one implementation, two switching regulators with different frequency responses are combined to provide wideband, efficient power.

5 Claims, 8 Drawing Sheets

METHOD AND APPARATUS FOR WIDE BANDWIDTH, EFFICIENT POWER SUPPLY

RELATED APPLICATION

This patent application is a divisional of, and claims priority to, pending patent application Ser. No. 14/070,502 filed Nov. 2, 2013 titled "Method and Apparatus for Wide bandwidth, Efficient Power Supply", which is hereby incorporated herein by reference.

FIELD OF THE INVENTION

The present invention pertains to power supplies. More particularly, the present invention relates to Method and Apparatus for Wideband, Efficient Power Supply.

BACKGROUND OF THE INVENTION

A fast response wide bandwidth and efficient power supply is needed for many electronic devices. For example, if the RF (Radio Frequency) Power Amplifier in a mobile phone is powered directly from a battery, the battery supply voltage may be too high, resulting in excess power dissipation in the power amplifier. This presents a technical problem for which a technical solution using a technical means is needed.

BRIEF DESCRIPTION OF THE DRAWINGS

The invention is illustrated by way of example and not limitation in the figures of the accompanying drawings in which.

DETAILED DESCRIPTION

The invention, in one embodiment, is a power supply which provides a reduced voltage which results in a more efficient power amplifier resulting in longer battery run time.

In one embodiment of the invention as applied to, for example RF power amplifiers, there is provided a power supply which can change its output voltage fast enough to track the rapidly changing power requirements of the power amplifier in real time.

In one embodiment of the invention, switch mode power supplies are efficient and used so that they are faster and efficient than a single switch mode power supply approach. That is, in one embodiment of the invention without using a single switch mode power supply for full power a faster, efficient power supply response is provided.

In one embodiment of the invention, without increasing the switching frequency of the main switch mode supply which increases switching losses and hence decreases the efficiency is provided a fast responding power supply.

In one embodiment of the invention, without placing a switching regulator output to directly couple to a linear regulator output in parallel a fast responding power supply is described.

In one embodiment of the invention, the large DC and low frequency component of power is delivered with a slow switching regulator and the small AC and high frequency component of power is delivered with a small, faster switching regulator and thus a faster and efficient power supply is described.

In one embodiment of the invention, the switching frequency of the fast switching regulator is higher than neighboring RF communication band frequency and thus a low interference power supply is described.

In one embodiment of the invention, the first switching regulator output is coupled to a second switching regulator output in parallel with a second switching regulator providing the current to cancel excess switching frequency ripple of the first switching regulator thus a more efficient power supply than a power supply where an inherently less efficient parallel linear regulator provides the ripple cancelling current is described.

In one embodiment of the invention, linear regulators are fast and used so that they are more efficient than a pure linear regulator approach. That is, in one embodiment of the invention without using a pure linear regulator for full power a more efficient approach is used.

Figure 1:
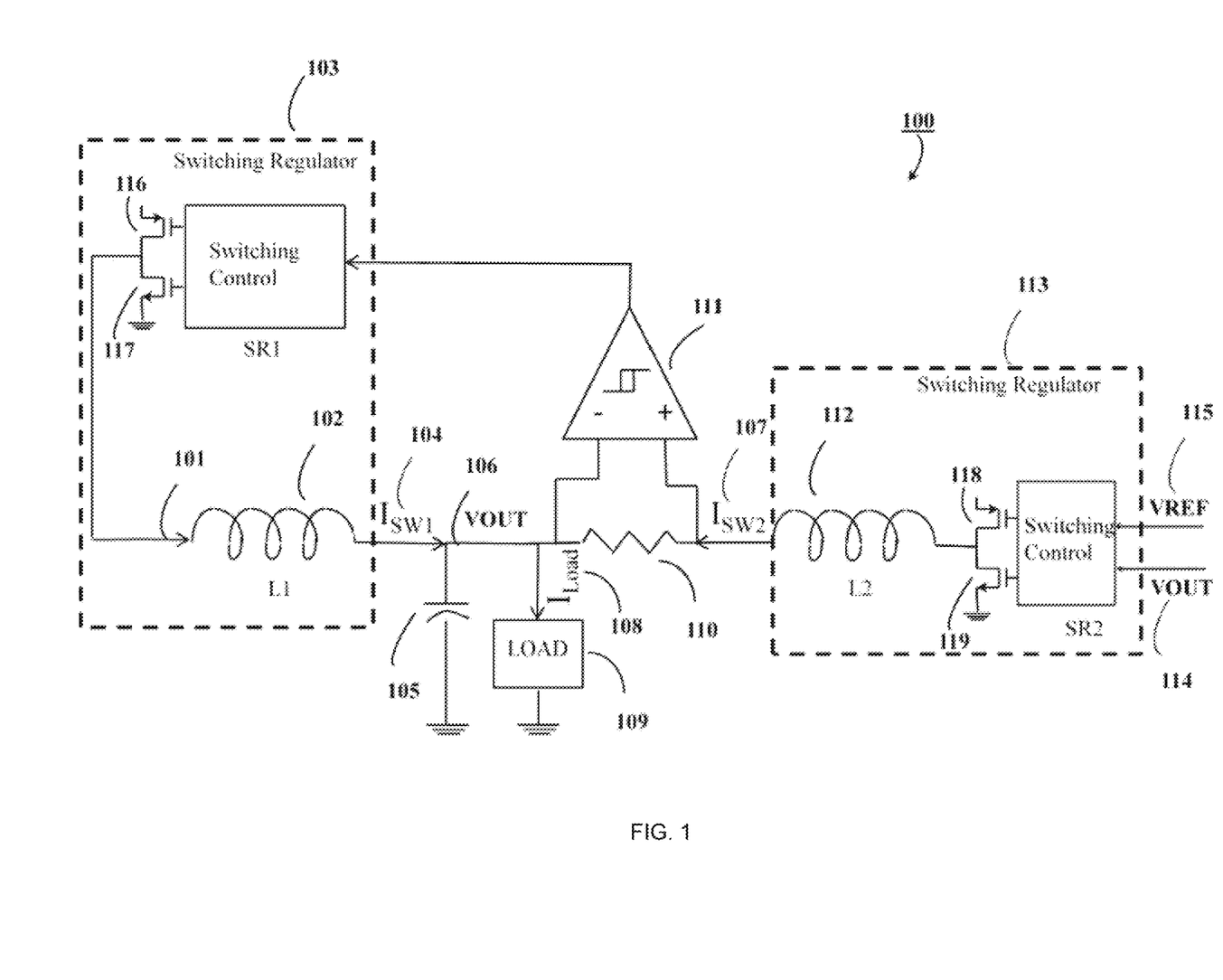
FIG. 1 illustrates one embodiment of the invention.

FIG. 1 illustrates, generally at 100, one embodiment of the invention. The power supply system 100 includes a low speed power supply 103 (for example, but not limited to, a buck type switching power supply with inductor L1 102, and an optional output capacitor 105) with its output $I_{SW1}$ 104 coupled to the load 109 at output VOUT 106 and delivering a load current $I_{Load}$ 108, and a high speed power supply 113 (for example, but not limited to, a buck type switching power with the inductor L2 112) with its output $I_{SW2}$ 107 coupled in parallel to the output VOUT 106 through the sense resistor 110. The low speed power supply 103 is made more efficient by sizing the power transistors 116 and 117 relatively bigger (101 is output of 116 and 117). This minimizes the conduction losses ($I^2R$ losses) caused by the resistance of the power device switches as bigger device size minimizes the switch resistance. However, bigger switch size also increases the switching losses and therefore the switching frequency of the low speed power supply is chosen relatively lower so as to minimize the switching losses. Thus the low speed power supply 103 provides power efficiently but due to its low switching speed cannot respond to rapidly changing power needs of the load 109. The high speed power supply 113 is in parallel with the low speed power supply 103 and the high speed power supply has its power devices 118 and 119 sized relatively smaller than the low speed power supply power devices 116 and 117. As an example, the 4G long term evolution (LTE) envelope signal has about 80% of the power in DC and low frequency. Since the high frequency power component is 20% or one-fifth of the total power, the power device sizes for the high speed power supply 113 can be scaled to, as an example, one-fifth the size of the power devices of the low speed power supply 103. Because of the smaller power devices, the switching frequency of the high speed power supply 113 can be made, as an example, five times higher than the low speed power supply without increasing switching losses compared to that of the low speed power supply.

The high speed power supply because of its higher switching frequency responds to the AC and high frequency components of the load power.

In general, switch mode power supplies are slow and not very efficient for high speed, wide band power delivery. However, the power supply 100 of the invention makes this possible by splitting the power delivery with a parallel combination of low speed and high speed switch mode supplies with the devices sized and frequency scaled optimally as per the speed and power supplied by the individual power supplies.

The outputs of the low speed and high speed power supplies can be combined in several different ways to provide the combined power to the load. In the power supply 100, the high speed power supply 113 regulates the output by sensing the output through sense network 114 and comparing it to the reference signal VREF 115, thus making VOUT track VREF in real time. Because of the high switching frequency, the high speed regulator 113 is able to track VREF; however delivering the entire power through this regulator makes it inefficient as the power switches 118 and 119 of this regulator are relatively smaller. The current delivered to the load $I_{SW2}$ 107 by the switching regulator 113 through inductor L2 112 is sensed by measuring the drop across the sense resistor 110. The hysteretic comparator 111 turns its output high when the switching regulator 113 is supplying the load, as the voltage drop across the sense resistor 110 caused by the load supplied by the switching regulator 113 makes the positive input of the comparator 111 higher than its negative input. When the comparator 111 output is high, the switching regulator 103 responds by turning its high side switch 116 on and thus sourcing current $I_{SW1}$ 104 to the load 109 at VOUT 106 through inductor 102. When $I_{SW1}$ ramps up high enough to supply the entire load current $I_{Load}$, any further increase in $I_{SW1}$ causes VOUT 106 to go high and hence the feedback 114 to go higher than VREF causing switching regulator 113 to sink current to keep VOUT in regulation. Since $I_{SW2}$ 107 is a sinking current now rather than sourcing current, the drop across the sense resistor 110 is negative causing the comparator 111 to change its output to low from being high. This in turn causes the switching regulator 103 to turn-off its high side switch 116 and to turn-on the low side switch 117, allowing it to ramp down the current $I_{SW1}$. When $I_{SW1}$ ramps down lower than $I_{Load}$, VOUT 106 and hence feedback 114 tries to go lower than VREF causing switching regulator 113 to source current to keep VOUT in regulation and the above cycle repeats itself. Thus, in steady state, the relatively higher efficiency, low speed switching regulator 103 makes the current $I_{SW2}$ 107 supplied by switching regulator 113 very small, approximately equal to the hysteresis of the comparator 111; providing most of the relatively large DC and low frequency power. Because the switching regulator 103 cannot respond fast enough to high speed signals, the high speed load power is delivered by the high speed switching regulator 113.

In this embodiment 100 of the power supply, the high speed power supply 113 acts as a voltage source and makes VOUT 114 voltage to track the signal reference voltage 115. The low speed power supply 103 acts as a constant current source by providing current $I_{SW1}$ 104 and making it track load current by sensing and minimizing the current $I_{SW2}$ 107.

Since, the high speed power supply 113 is acting like a voltage source and is of high speed, the energy storing capacitor 105 is optional and may not be needed as the regulator 113 responds to fluctuations in VOUT and keeps it constant.

Figure 2:
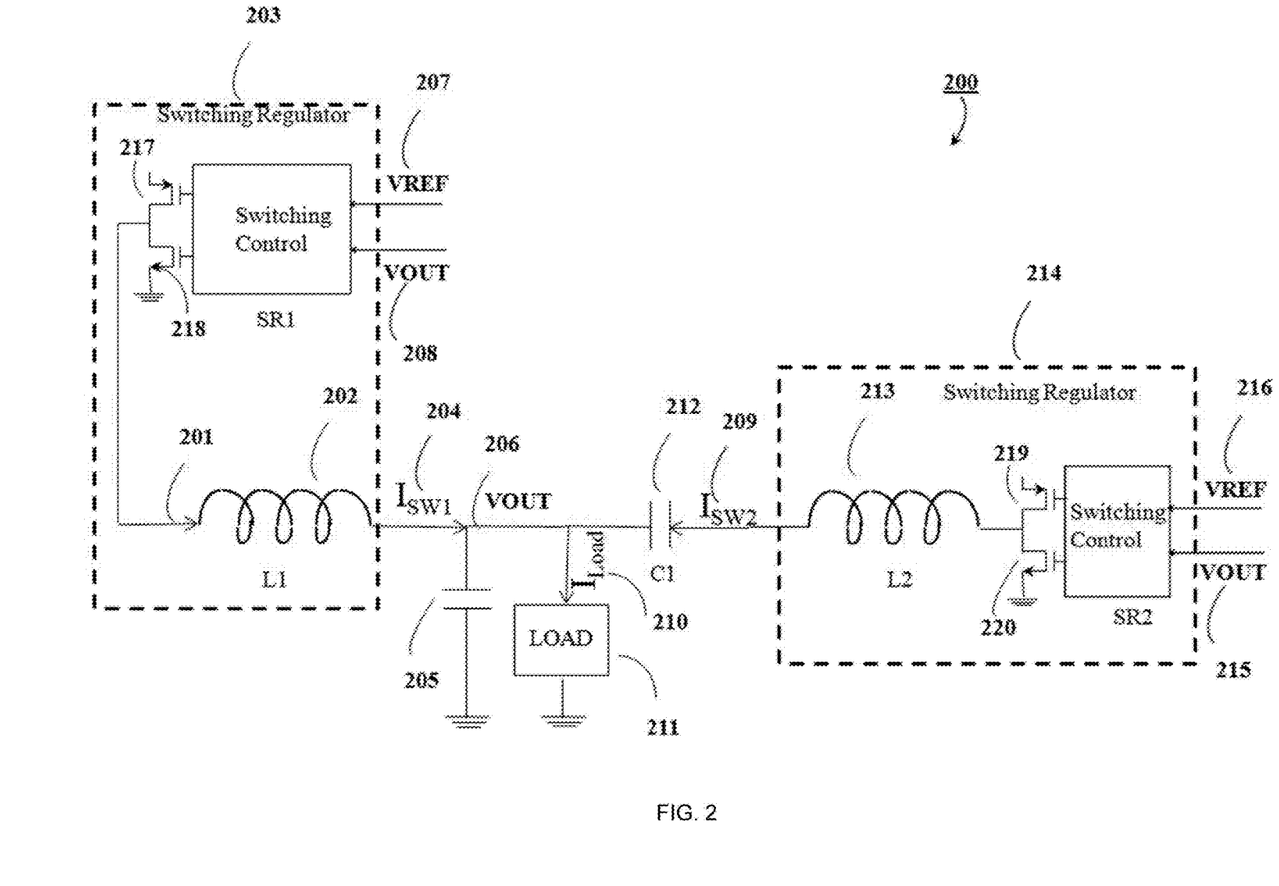
FIG. 2 illustrates a second embodiment of the invention.

FIG. 2 shows another embodiment of the invention of a wide bandwidth efficient power supply 200. The operation of the power supply 200 is similar to that of the power supply 100 in FIG. 1 as the power is delivered to the load with a combination of two switch mode power supplies, a lower speed, lower switching frequency power supply 203 with output 204 (current $I_{SW1}$) delivering DC and low frequency power to the load 211 at VOUT 206 through inductor L1 202 and high speed, higher switching frequency power supply 214 with output 209 (current $I_{SW2}$) delivering high frequency, AC power through the inductor L2 213. Similar to the power supply 100, the power supply 200 is made efficient by keeping the power switch sizes of 219 and 220 of the high frequency regulator 214 relatively smaller, thus minimizing switching losses and enabling efficient high frequency operation and reducing conduction losses by only responding to lower power, high frequency signals. On the other hand, the low speed regulator 203 has relatively bigger switch devices 217 and 218 (201 is output of 217 and 218); thus it minimizes the conduction losses by reduced switch resistance and by only responding to low frequency and DC signals. Thus the combination of these two switchers (power supplies) results in a power supply 200 which is efficient for all signal frequencies.

Similar to the power supply 100, the low speed and high speed regulators of the power supply 200 are coupled in parallel to provide combined output power to the load 211 at the output 206. However, the power delivered by the high speed power supply 214 is coupled to the output through the capacitor C1 212. For DC and low frequency signal content, the low speed switching regulator 203 senses output VOUT 206 through feedback network 208 and compares it with the signal reference VREF 207. Thus switching regulator 203 with the inductor 202 and feedback network 208 forms a closed loop system and keeps VOUT 206 in regulation for DC and low frequencies and deliveries the load power. Because the switching regulator 203 is of lower switching frequencies, it cannot track high signal frequencies of the signal VREF 207. Switching Regulator 214 with higher switching frequency and smaller switch sizes is able to track high frequency content of the VREF efficiently and delivers the AC and high frequency power to the load 211 through the inductor 213.

In the embodiment of the power supply 200, both the low speed regulator 203 and the high speed regulator 214 are connected in parallel and try to regulate VOUT 206 (also shown routed to 208 and 215) to VREF 207, 216, any offsets in the input stages will make offset DC current to flow from output of one switching regulator to the other switching regulator. This results in excess power dissipation as this current is not supplied to the load. To prevent this, output 209 of the high speed regulator 214 is coupled to the output VOUT 206 through the capacitor C1 212. This capacitor blocks the DC current from flowing into and out of high speed regulator 214 and only allows regulator 214 to supply AC and high frequency power to the load 211 shown with a current $I_{Load}$ 210. Thus the power delivered by the switching regulators 203 and 214 are efficiently combined to deliver total power to the load 211.

Similar to the power supply 100, since, the switching regulator 214 is acting like a voltage source and is of high speed, the energy storing capacitor 205 is optional and may not be needed as the regulator 214 responds to fluctuations in VOUT 206 and keeps it constant.

Figure 3:
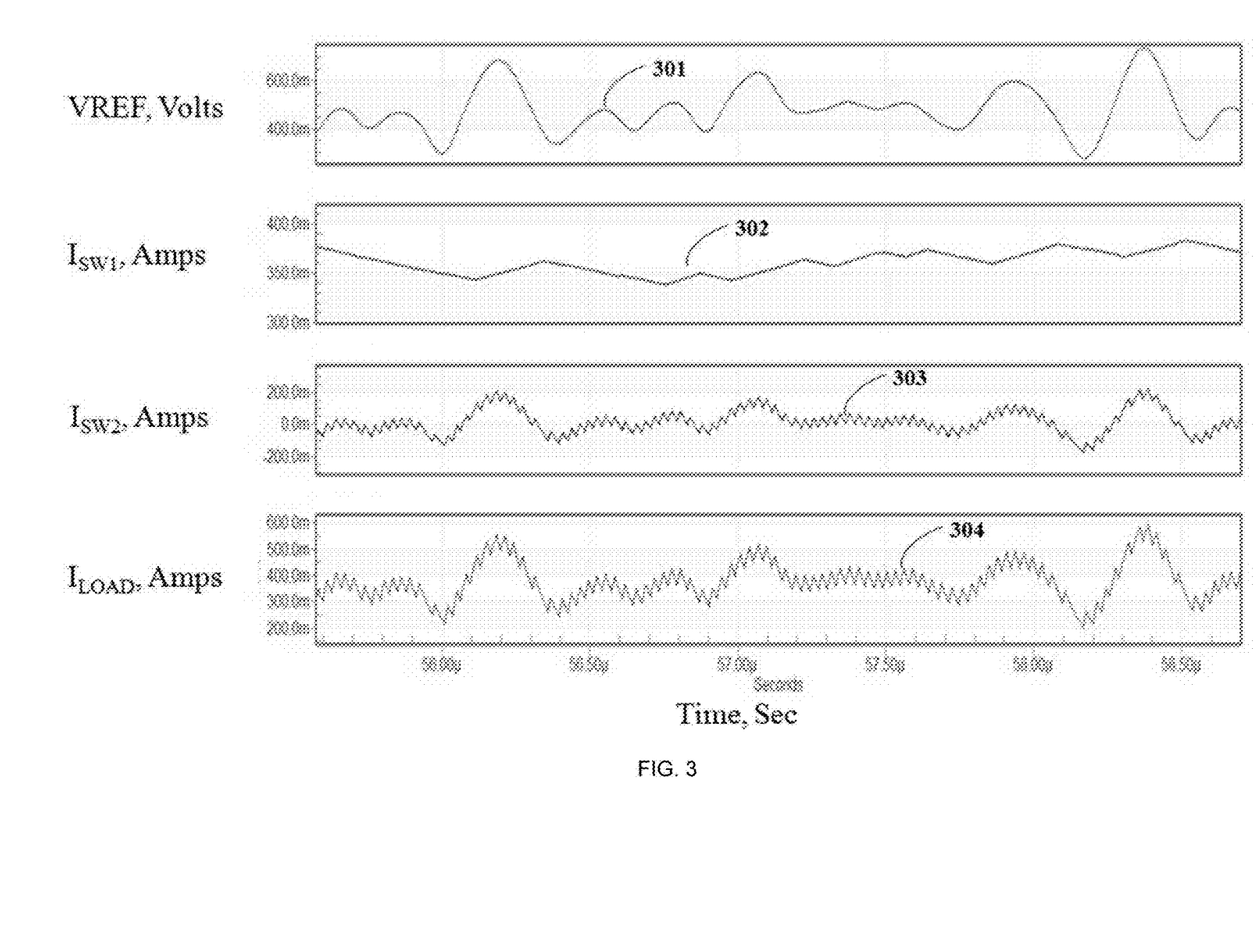
FIG. 3 illustrates waveforms that correspond to the operation of the circuits of FIG. 1 and FIG. 2.

FIG. 3 shows the simulated waveforms for the power supplies 100 and 200. As an example without limitation, the first waveform VREF 301 shows the input signal waveform and is an envelope signal for the 4G long term evolution (LTE) envelope tracking power amplifier. It has both DC and AC components; the average value or the DC value is about 500 mV and has fast changing AC levels above and below this average level. The second waveform 302 shows the power delivered to the load by the slow regulator (103 in FIGS. 1 and 203 in FIG. 2). As can be seen from this waveform, it is slow moving and cannot track the fast changes in the VREF 301 but provides the average or DC load current of about 375 mA. Third waveform 303 shows the power delivered to the load by the fast regulator (113 in FIGS. 1 and 214 in FIG. 2) and has very little DC content as the average value is close to zero but tracks close to VREF 301 in AC and high frequencies and delivers the AC power to the load. The fourth waveform 304 is the load which is the summation of the currents supplied by both the slow and fast regulators and as can been seen it has both a DC component (average value about 375 mA) and tracks the reference signal VREF 301 in AC very closely as well; thus by combining the power from both the regulators a fast, wide band regulator power supply delivers the load power efficiently.

In FIG. 3, the waveforms 303 and 304 show high frequency ripple which is not present in the reference signal waveform 301. This ripple is generated by the switching frequency of the fast regulator (113 in FIGS. 1 and 214 in FIG. 2). The ripple generated by the switching frequency of the slow regulator is cancelled by the fast switching regulator, more efficiently compared to cancelling it by using a linear regulator, and the load doesn't see the low frequency switching ripple as can seen by the load current waveform 304. Since the load sees the high switching frequency ripple, this switching frequency ripple could be cancelled by a notch filter with a notch at the switching frequency of the high frequency switcher but this needs additional components for the notch filter and may not be desirable. As an alternate, this ripple could be cancelled by an additional linear regulator but is not as efficient, as the switching ripple cancellation current is supplied by the inefficient linear regulator. In addition, the linear regulator may not have enough gain and or bandwidth to effectively cancel the ripple and its harmonics. Any possible ripple issues could be avoided if the switching frequency of the fast regulator is carefully chosen.

Figure 4:
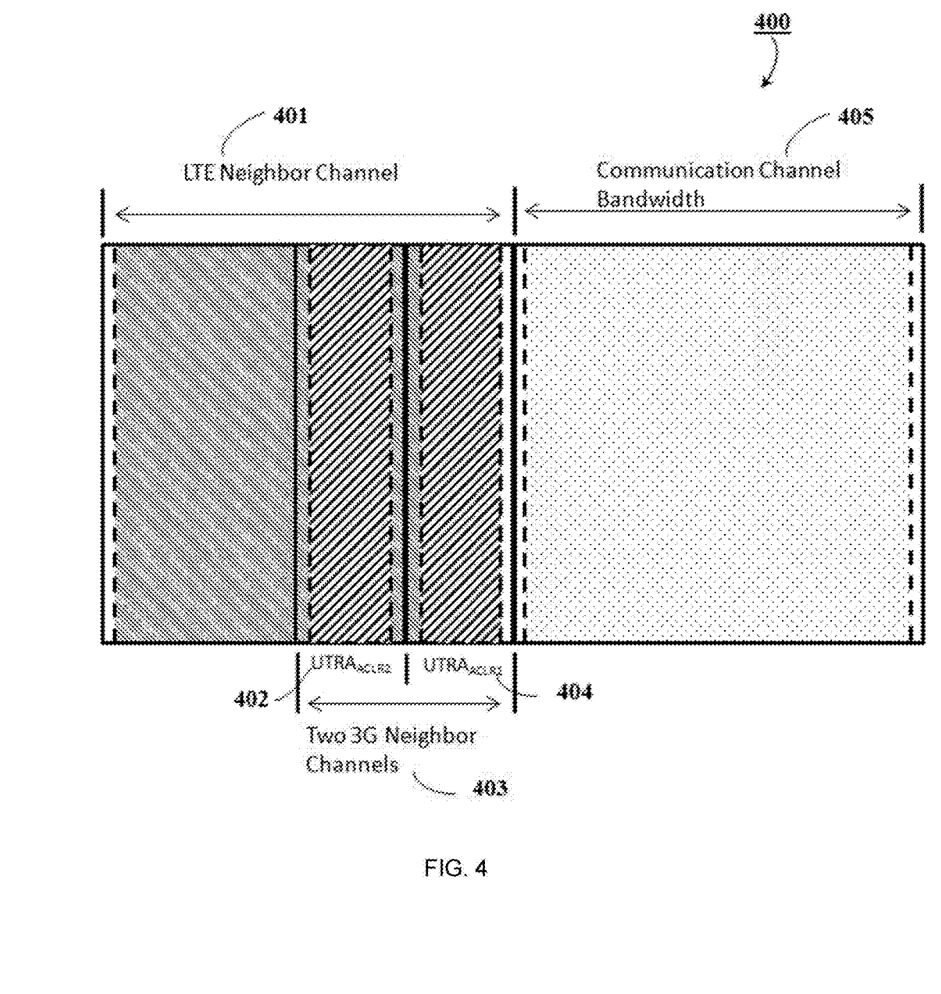
FIG. 4 illustrates a first RF communication band and adjacent neighboring RF communication band according to one embodiment of RF communication systems.

As an example without limitation, FIG. 4 shows, generally at 400, 3$^{rd}$ Generation Partnership Project (3GPP) cellular communication bands. Communication channel band 405 is the assigned channel bandwidth for the particular carrier. 4G Long Term Evolution (LTE) could support several bandwidths such as 1.4 MHz, 5 MHz, 10 MHz and 20 MHz. The power supplies of 100 and 200 could be used to provide envelope tracking power to the power amplifier of the 4G LTE transmit signal. When a power amplifier is transmitting a signal, there are specifications for in-band noise emissions and neighboring band leakage. The neighboring band could be two 3G neighbors 403 (shown including 402 and 404), each with 5 MHz bandwidth or a 4G neighbor 401 with bandwidth equal to the communication channel bandwidth 405. As an example, if the communication channel is of 10 MHz bandwidth, out of this 10 MHz, the particular transmission may be assigned the entire 10 MHz Bandwidth or a portion of it. If it is assigned only a portion of the transmit bandwidth, and if the assigned sub-carrier frequency for transmit signal is offset from the center of the assigned channel, then to avoid any in band emissions and leakage into neighboring band, the switching ripple frequency from the high frequency switcher must be chosen at least to be higher than the 10 MHz communication bandwidth plus the 10 MHz adjacent neighbor channel bandwidth 401 i.e. the high frequency switcher frequency needs to be at least 20 MHz if it's used to power a 10 MHz channel LTE power amplifier. In the example shown in FIG. 3, the high frequency switcher frequency is chosen to be 35 MHz as can be seen from the switching ripple frequency in the graphs 303 and 304. In addition, it may be desirable to make the switching frequency selectable or programmable to result in a most efficient solution as the assigned signal bandwidth may be one of several possible choices. Thus if the assigned channel bandwidth is 5 MHz, then selecting too low a frequency for the switcher will result in not truly tracking the signal and on the other hand making it too high will result in poor efficiency due to excessive switching losses. For this example, if the switching frequency is chosen to be at least 25 MHz i.e. at least five times the signal bandwidth, it will track the signal effectively and in addition, the switching frequency is also higher than the adjacent neighbor channel frequency, thus not causing any leakage into the adjacent channel. Similarly, if the communication channel bandwidth is 20 MHz, the switching frequency of the switcher needs to be at least 40 MHz to avoid adjacent channel leakage and at least 100 MHz to track the signal effectively.

Typically, the switching frequencies of the switchers have been limited to less than a few MHz's. In general, closed loop switchers need error amplifiers with compensation which limits the switching frequency. The high frequency switchers 113 and 204 of FIGS. 1 and 2 could be open loop switchers. Open loop switchers are faster as they use comparators, which are inherently faster than amplifiers with compensation, to compare the signal with the output. The output of the comparator then drives the power switches through intermediate non-overlap driver and buffer stages. The switching frequency of this open loop switcher is set by the comparator delay, buffer stage delay, inductor value and hysteresis (if present) of the comparator and output capacitor value (if present). Since, in the power supplies of 100 and 200, the large DC power and small AC power is split between two switchers, power switch sizes of the high frequency AC switcher can be reduced as explained in detail above. Due to the decreased size of the power switches, the delay introduced by the non-overlap drivers and buffers stages is reduced as the number of stages can be reduced. This in addition helps in making the switching frequency higher in addition to reducing switching losses from the power devices because of their smaller size.

In other embodiments, additional switching regulators with additional different frequency responses (typically realized with different inductor sizes, with smaller inductors resulting in higher frequencies) could be added in parallel to the power supplies of 100 and 200 and based on the frequency content of the signal VREF, one of these additional parallel switching regulators is enabled in addition to the DC slow response switcher to provide additional enhancement in speed and efficiency over a wider bandwidth.

Figure 5:
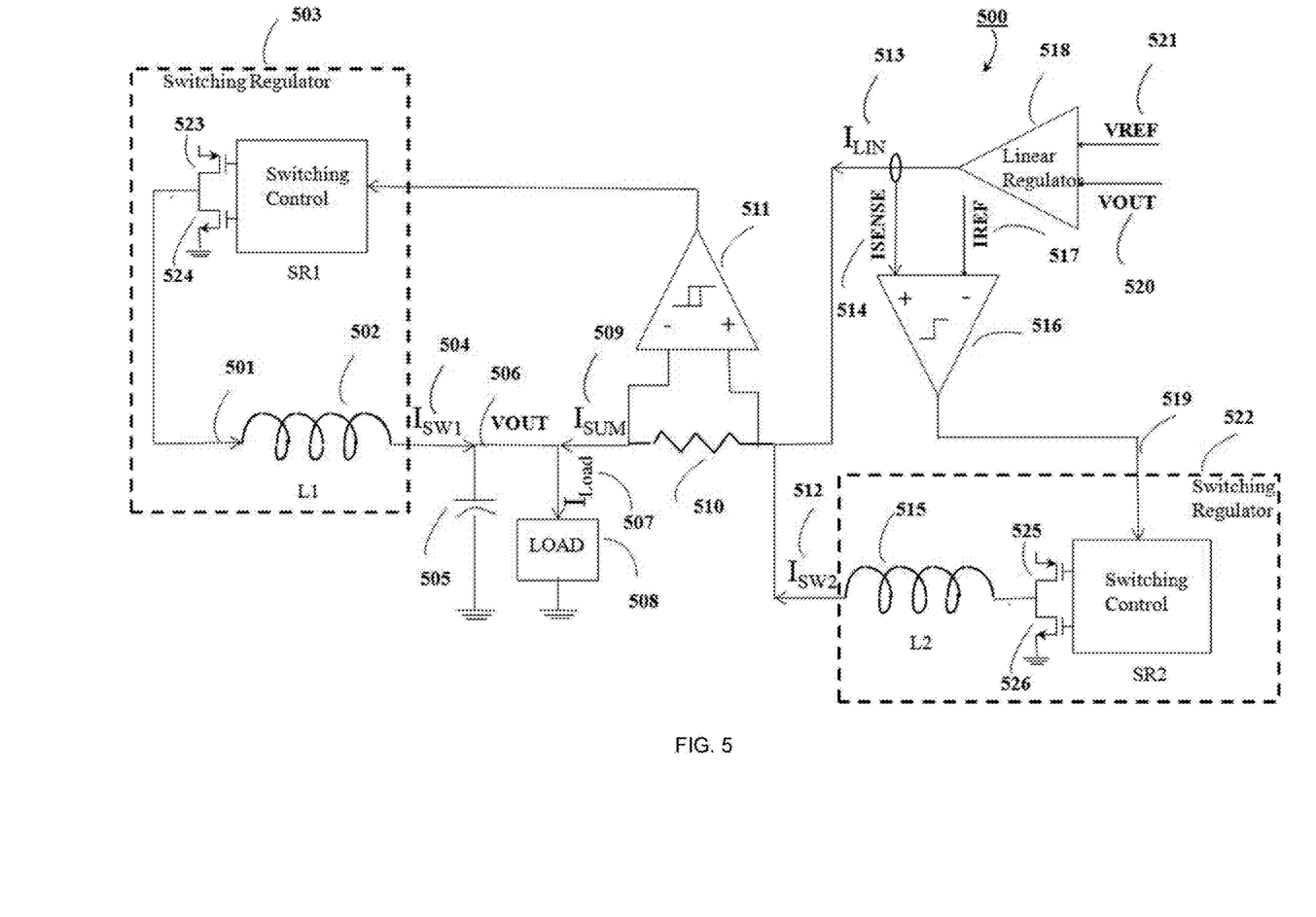
FIG. 5 illustrates one embodiment of the present invention.

FIG. 5 shows another embodiment, generally at 500, of a power supply of the invention. The operation of the low frequency switcher 503 (as an example, but not limited to, a step-down buck regulator) and high frequency switcher 522 (as an example, but not limited to, a step-down buck regulator) is similar in operation to the low frequency switcher 103 and high frequency switcher 113 of the power supply 100 in FIG. 1; with the low frequency switcher 503 providing most of the DC and low frequency power to the load 508 through its output 504 (with current $I_{SW1}$) and the high frequency switcher 522 providing most of the AC and high frequency power to the load 508 through its output 512 (with current $I_{SW2}$). However, there's an additional regulator 518 coupled in parallel with the two switching regulators with its output 513 (with current $I_{LIN}$).

The power supplies 100 and 200 work well when the signal bandwidth is not very high but less than 5 MHz to 10 MHz bandwidth. However, when the signal bandwidth exceeds this, the switching frequency and switcher bandwidth need to increase as well. As an example, if the signal is of 40 MHz bandwidth, to track this signal, switcher bandwidth of 5 to 10 times the signal bandwidth i.e. at least 200 MHz is needed. Switchers with 200 MHz bandwidth are not practical. Therefore to aid in tracking the signal, which is varying very rapidly beyond the capability of the high speed switcher 522, the high speed linear regulator 518 is added. Since linear regulators do not use inductors, they are faster than the switchers but they are less efficient. Thus in the power supply of 500, if the fast switcher 522 is removed and the entire high frequency power is supplied by the fast linear regulator 518, the resulting power supply is not very efficient. Thus in the power supply 500 the high frequency power is split between the linear regulator 518 and the fast switcher 522 with the switcher 522 trying to minimize the power delivered by the linear regulator.

The high speed linear regulator 518 regulates the VOUT 506 by comparing VOUT 506 through feedback network at VOUT 520 and comparing it to the reference signal VREF 521 and acts as a high speed voltage source. In order to minimize the power delivered by the inefficient linear regulator, the current sense element 516 senses the current delivered by the linear regulator at 514 (ISENSE). Whenever, this current is positive i.e. current is sourced by the linear regulator 518, the switching regulator 522 turns on its high side power switch 525 and sources current to the load through Inductor L2 515. As the current provided by the switching regular 522 is ramping and reaches high enough to supply load 507 $I_{LOAD}$, VOUT 506, 520 starts to exceed VREF 521. The linear regulator 518 senses this and starts to sink current to keep VOUT 506 in regulation. The directional current sense 516 senses that linear regulator current is sinking rather than sourcing (compared to the reference current IREF 517) and changes its output 519 polarity. The switching regulator 522 senses this and turns off its high side current source switch 525 and turns on its low side power switch 526 and starts sinking current. When $I_{SW2}$ 512 ramps down to needed load current 507 $I_{LOAD}$, VOUT 506, 520 starts to go down below VREF 521. Linear regulator 518 senses this and starts to source current to keep VOUT 506 in regulation. The above operation thus repeats itself.

Since linear regulators are not very efficient and also because the high frequency switcher 522 is efficient for high frequency operation but not very efficient for DC and low frequencies due to the smaller switch sizes for the devices 525 and 526, the low frequency switcher 503, which is efficient for DC and low frequency power because of the relatively bigger device sizes for its power devices 523 and 524 (the output of 523 and 524 indicated at 501), provides most of the DC and low frequency power by sensing the combined power delivered by linear regulator 518 and high frequency switcher 522 through the voltage drop across the sense resistor 510 by the current $I_{sum}$ 509 which is the combined current supplied by the linear regulator 518 at its output $I_{LIN}$ 513 and by the high frequency switcher at its output $I_{SW2}$ 512.

The hysteretic comparator 511 turns its output high when $I_{sum}$ 509 is supplying the load current 507 $I_{Load}$, as the voltage on the sense resistor 510 is higher on the positive input of the comparator 511 than the negative input in this case. When the comparator 511 output is high, the switching regulator 503 responds by turning its high side switch 523 on and thus sourcing current $I_{SW1}$ 504 to the load 508 at VOUT 506 through inductor L1 502. When $I_{SW1}$ 504 ramps up high enough to supply the needed load current $I_{Load}$ 507, any further increase in $I_{SW1}$ 504 causes VOUT 506 to go high and hence the feedback 520 to go higher than VREF 521, causing linear regulator 518 to sink current to keep VOUT 506 in regulation. Since $I_{LIN}$ 513 and hence $I_{SUM}$ 509 is sinking current (as high frequency switcher 522 starts sinking current when the linear regulator 518 is sinking current) rather than sourcing current, the drop across the sense resistor 510 is negative causing the comparator 511 to change its output to low from being high. This in turn causes the switching regulator 503 to turn-off its high side switch 523 and turn-on the low side switch 524 allowing it to ramp down the current $I_{SW1}$ 504. When $I_{SW1}$ 504 ramps down lower than the needed load current $I_{Load}$ 507, VOUT 506 and hence feedback 520 tries to go lower than VREF 521 causing linear regulator 518 to source current to keep VOUT 506 in regulation and the above cycle repeats itself.

Thus, in steady state, the relatively higher efficiency, low speed switching regulator 503 makes the current $I_{SUM}$ 509 supplied by the linear regulator 518 and switching regulator 522 very small, approximately equal to the hysteresis of the comparator 511 and thus provides most of the relatively large DC and low frequency power. Because the switching regulator 503 cannot respond fast enough to high speed signals, the high speed load power is delivered by the linear regulator and the high speed switching regulator.

Thus in the power supply 500, the power is efficiently split among the parallel connected linear regulator, the high speed switcher, and the low speed switcher. The linear regulator acts as a high frequency voltage source and keeps VOUT in regulation by making it track the signal VREF. The low speed switching regulator and the high speed switching regulators act as current sources with high frequency switching regulator 522 trying to make the linear regulator power minimal by providing most of the high frequency power and the low frequency switching regulator trying to make the combined power from the linear regulator and the high frequency switching regulator minimal by providing most of the DC and low frequency power.

Similar to the power supplies 100 and 200, since, the linear regulator 518 is acting like a voltage source and is of high speed, the energy storing capacitor 505 is optional and may not be needed as the regulator 518 responds to fluctuations in VOUT 506 and keeps it constant.

Figure 6:
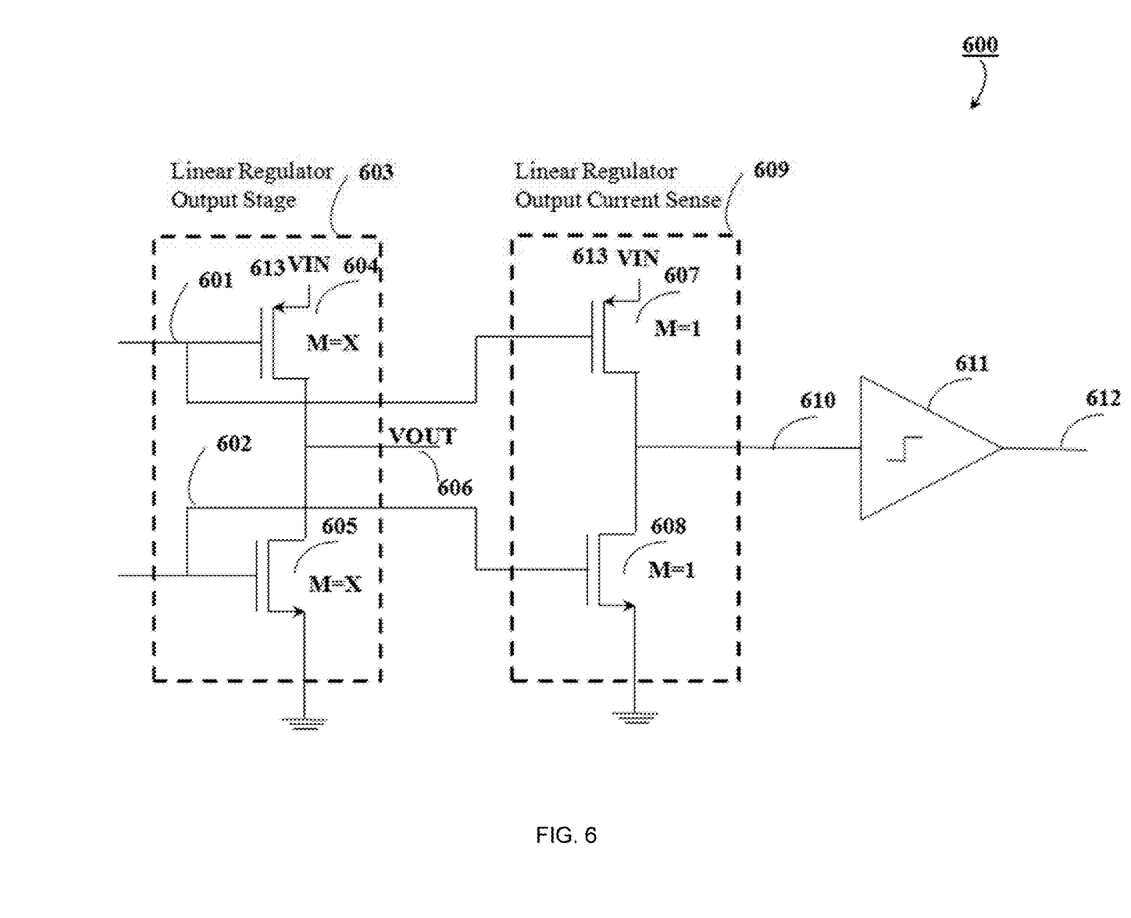
FIG. 6 illustrates current sense circuitry of embodiment of FIG. 5.

FIG. 6 shows, generally at 600, an example implementation for the linear regulator current sense element 516 of the power supply 500. Since the high speed switching regulator 522 doesn't provide any DC current but tries to minimize AC current supplied by the linear regulator by sourcing current whenever the linear regulator is sourcing current and vice versa, speed is more critical for the current sense element 516 than accuracy. In FIG. 6, transistors 604 and 605 represent the output stage of the push-pull linear regulator output stage 603, for example the output stage of the linear regulator 518 in FIG. 5. If the linear regulator is sourcing current, since current is sourced by 604 as it is connected to the positive supply VIN 613, it is carrying more current than transistor 605. Similarly, when the linear regulator 603 is sinking current, transistor 605 sinks current and hence it is carrying higher current than the transistor 604. Devices 607 and 608 in the linear regulator output current sense 609 are current mirror devices for 604 and 605 respectively. Devices 604 and 607 have their gates 601 tied to same potential and their sources tied to VIN 613, hence their gate-source voltage is same, thus making the current of 607 match approximately to that of 604 (since the device width (M) of 607 is M=1 versus M=X of 604, its currents are scaled by the same factor). Similarly the gates 602 of 608 and 605 are tied to the same potential, the current of 608 matches approximately the scaled version of the current of 605. By tying the drains of the devices 607 and 608 at 610, when the linear regulator output stage 603 is sourcing current, since 604 carries higher current than 605, thus the scaled versions 607 carries higher current than 608 and hence pulls 610 to go high. Similarly, 610 is pulled down low when the linear regulator output stage 603 is sinking current. Thus, the state of the node 610, whether it is high or low, indicates whether the push-pull linear regulator output stage is sourcing or sinking current (shown at node 606 VOUT).

611 could be a Schmitt trigger or a logic gate like an inverter providing additional gain and also acting as a buffer to the signal 610 producing output 612. Since this current sense implementation doesn't need sensing a voltage drop across a resistor with a comparator, but rather uses current mirrors and digital gates it is much faster.

To further improve the efficiency of the power supply 500 additional optional control inputs could be provided to the high speed switching regulator 522 to make it respond faster and deliver more of the high frequency power. Instead of waiting until the linear regulator 518 starts sinking current to turn on the low side device 526 to ramp down the $I_{SW2}$ 512 current, the sink device 526 could be turned on when the signal VREF 521 starts going down. The linear regulator 518 starts sinking current when signal 521 goes lower than the signals average value as the low speed switcher is supplying the current proportional to the average value of the signal. Since there is inherent delay in ramping the inductor 515 current down, the high speed regulator 522 could be made faster by making it ramp down the inductor 515 current when the signal 521 starts going down rather than waiting until the signal goes below average value and similarly to source current, the high side device 525 could be turned on when the signal 521 starts going up rather than waiting until the signal to go above the average value and making linear regulator 518 to source current. This optional control input to the switcher 522 to indicate whether the signal is going up or going down could be generated easily by comparing the signal 521 to a delayed version of it to see whether it's higher or lower. In addition, this optional control input could be provided by a baseband processor integrated circuit. This optional control input helps improve efficiency if the signal 521 frequency is comparable to the inductor 515 current slew rates.

Figure 7:
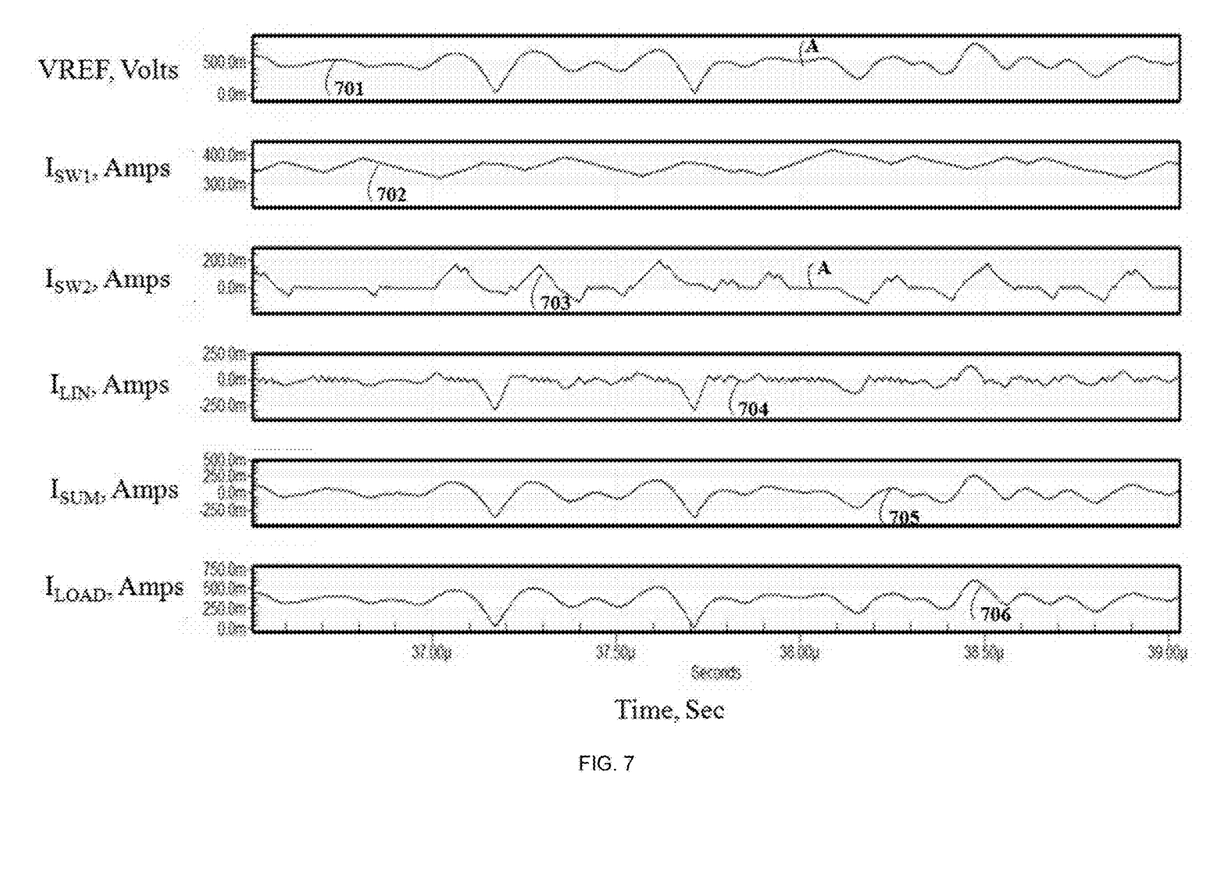
FIG. 7 illustrates waveforms that correspond to the operation of the circuits of FIG. 5.

FIG. 7 shows the simulated results for the power supply 500 in the FIG. 5. The signal VREF 701 is a high frequency signal with frequency components up to 10 MHz and also has a significant DC content as the average value of the signal is about 500 mV. Second waveform 702 shows the current $I_{SW1}$ supplied by the low frequency switcher 503; as can be seen it carries a significant average current of about 350 mA but doesn't track the reference signal VREF for high frequencies. Third waveform 703 shows the current $I_{SW2}$ supplied by the high speed switcher 522; it provides very little DC current as its average value is close to 0 mA but provides significant AC and high frequency currents as it tries to track the high frequency components of the signal VREF. Fourth waveform 704 shows the current $I_{LIN}$ supplied by the linear regulator 518; its average value is also close to zero but provides the AC and high frequency current which the high speed switcher is unable to supply and in addition supplies the current to cancel the switching ripple current of the high speed switcher and any leftover ripple current of the low speed switcher 503 which the high-speed switcher is unable to cancel. Fifth waveform 705 shows the combined linear and high speed switcher current $I_{SUM}$; its DC (average value) is zero but tracks the AC high frequency components of the signal VREF closely and finally the sixth waveform 706 shows the total power supplied to the load; it has a DC value equal to that of the second waveform 702 and an AC value equal to the fifth waveform 705 and tracks the signal VREF both in DC and high frequencies. Thus the combination of the low speed switcher, high speed switcher, and linear regulator splits the power efficiently and delivers the power over a wide signal bandwidth.

To further improve the efficiency of the power supply 500, it may be desirable to turn off the linear regulator 518 or high speed switching regulator 522 selectively. If the signal VREF 521 bandwidth is not very high but within the bandwidth range of the high speed switcher 522, the linear regulator 518 could be turned off and high speed regulator could be configured similar to the power supply of 100 with control for the switcher 522 generated by comparing VOUT 520 with the signal VREF 521 rather than the current sense element 516, thus splitting the power delivered to the load between the low speed and high speed switchers. Similarly, when the signal bandwidth approaches the high speed switcher switching frequency, the high speed switcher may run anti-phase to the signal, i.e. sinking current when it needs to source current and vice-versa. In this case, it may be desirable to turn-off high speed switcher and split the power delivered to the load between the linear regulator (providing the entire AC load) and the low frequency switcher providing the entire DC load. In addition, when the signal is of low frequency and not varying fast (for example at time A in the waveform 701), it may be desirable to turn-off the high speed switcher to minimize it's switching losses and the low speed switcher will provide the entire load current. Thus, the high frequency switcher 522 could be enabled by a band-pass filter detecting the signal frequency and disabling the high speed switcher when the signal frequency is too low (within the bandwidth range of the low speed switcher) and also when the signal frequency is too high (beyond the bandwidth range of the high speed switcher).

In addition, under light load conditions, it may be desirable to turn-off both the switching regulators 503 and 518 and have the entire load current supplied by the linear regulator 518. This minimizes the switching losses from the switcher and improves efficiency in the low power modes.

Additionally, similar to the power supply 200 wherein the high frequency switcher output $I_{SW2}$ is coupled to the output VOUT 206 through a capacitor 212 and the low speed switching regulator 203 is configured to receive control inputs VREF 207 and VOUT 208, the power supply 500 could be configured such that the low speed switching regulator receives the inputs VREF 521 and VOUT 506 to control its switching.

Although, in the power supplies 100 and 500, the current sense elements 111 and 511 are shown as hysteretic comparators providing a control signal to the switching regulators 103 and 503, these comparators could be replaced with amplifiers providing switching regulators 103 and 503 with an amplified current sense signal to control the switching of the low speed regulator, wherein the switching regulator controls and regulates this sensed current. Likewise, the switching regulators 103,113, 203, 214, 503 and 522 of the power supplies 100, 200 and 500 could be implemented as open loop comparator controlled switching regulators or closed loop constant frequency PWM (pulse width modulated) switching regulators, etc. and the present invention does not place any limitations on the architecture of the individual switching regulators and how those are implemented.

In addition, additional filtering and/or isolation components may be placed between the output of the switching regulator and the load. These may include, but are not limited to, an additional inductor coupling the switching regulator output to the load to provide additional switching frequency ripple suppression as an example.

Likewise there are several ways to implement the output sense feedback networks. For example, the output VOUT sense in 114, 208, 215, 520 for the power supplies 100, 200 and 500 respectively could just be a direct electrical connection to the output 106, 206 and 506 or could include a resistor divider network from VOUT to ground with the sense signals coming from the divided down version of the output. In addition, capacitors could be added in parallel with the resistor network to shape the frequency response of the switching regulators.

While not germane to the operation or techniques disclosed, one of skill in the art will appreciate that the devices types of devices, for example, as shown at 116, 117, 118, 119, 217, 218, 219, 220, 523, 524, 525, 526 may be fabricated in different polarities as well as technology types, for example, but not limited to, CMOS (complementary metal oxide semiconductor (MOS)) devices, Bipolar devices, DMOS (double diffused MOS) devices, NMOS (n-type MOS), PMOS (p-type MOS) devices, etc. Additionally the power systems of the present invention can be implemented in CMOS, BiCMOS (bipolar CMOS), BCD (BiCMOS and Bipolar, CMOS and DMOS), GaAs (gallium arsenide), GaN (Gallium nitride) SOI (silicon on insulator), or other processes. In addition these devices for the clarity of explanation of the invention are shown to be step down buck type synchronous (switches for both high side and low side devices) switchers. Without limitation, the present invention could be applied to additional switcher types, for example non-synchronous switchers, buck-boost switchers, etc.

Figure 8:
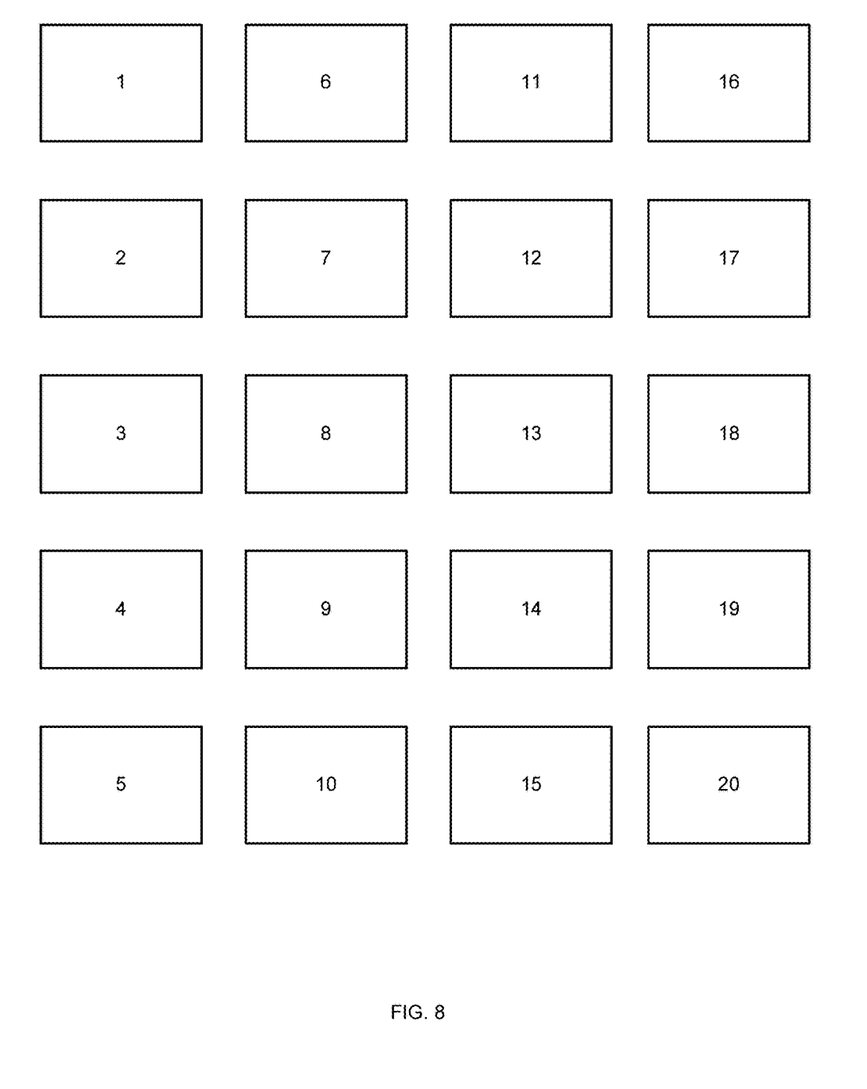
FIG. 8 illustrates various embodiments of the invention.

FIG. 8 illustrates various embodiments of the invention as indicated below.

Illustrated generally at 1. A power supply comprising: a first switching regulator with a first frequency response and a first output; a second switching regulator with a second frequency response and a second output; wherein said first output and said second outputs are coupled in parallel to provide a combined output.

Illustrated generally at 2. The power supply of 1 wherein said first regulator provides most of a direct current (DC) and a low frequency power in said combined output, and said second regulator has a faster frequency response and provides most of a high frequency power in said combined output.

Illustrated generally at 3. The power supply of 2 wherein said first regulator has power device switch sizes which are larger and less resistive than power device switch sizes in said second switching regulator.

Illustrated generally at 4. The power supply of 2 further comprising a Radio Frequency (RF) communications system wherein said power supply provides envelope tracking power to an RF power amplifier (PA) in said RF communications system; wherein said RF power amplifier is adapted to amplify and transmit signals in a first RF communication band having a first bandwidth; wherein a second RF communication band is adjacent to said first RF communication band, said second RF communication band having a second bandwidth; and wherein a switching frequency of said second switching regulator is at least greater than a bandwidth which spans a sum of said first bandwidth and said second bandwidth.

Illustrated generally at 5. The power supply of 2 wherein a magnitude of current in said second output provides a control signal for said first switching regulator such that said first switching regulator operates to reduce an amount of DC and low frequency current supplied by said second switching regulator.

Illustrated generally at 6. The power supply of 2 wherein said second output is coupled to said first output through a capacitor producing a combined output Illustrated generally at 7. The power supply of 6 wherein said first switching regulator power has device switch sizes which are larger and less resistive than power device switch sizes in said second switching regulator.

Illustrated generally at 8. The power supply of 2 further comprising one or more additional switching regulators with different frequency responses coupled in parallel with said combined output, and wherein based on a frequency content of power to be delivered to said combined output, only said first switching regulator and only one of said one or more additional switching regulators are providing power to said combined output.

Illustrated generally at 9. A power supply comprising: a first switching regulator with a first frequency response and having a first output; a second switching regulator with a second frequency response and having a second output; a third linear regulator having a third output: and wherein said first output and said second output and said third output are coupled in parallel to provide a combined output.

Illustrated generally at 10. The power supply of 9 wherein said first switching regulator provides most of a DC and a low frequency power in said combined output, and wherein said second switching regulator and said third linear regulator have a higher frequency response than said first switching regulator and provide most of a high frequency power in said combined output.

Illustrated generally at 11. The power supply of 10 wherein said first switching regulator has power device switch sizes that are larger and less resistive than power device switch sizes in said second switching regulator.

Illustrated generally at 12. The power supply of 10 wherein said third linear regulator third output provides a control signal for said second switching regulator such that said second switching regulator operates to reduce an amount of high frequency current supplied by said third linear regulator third output.

Illustrated generally at 13. The power supply of 12 further comprising a method to sense a direction of current in said linear regulator third output by mirroring a high side device current in said linear regulator's third output and mirroring a low side device current in said linear regulator's third output and comparing said mirrored high side device current with said mirrored low side device current.

Illustrated generally at 14. The power supply of 10 wherein a summation of current from said second output and current from said third output provides a control signal for said first switching regulator such that said first regulator operates to reduce an amount of DC and low frequency current supplied by said second switching regulator and said third linear regulator.

Illustrated generally at 15. The power supply of 10 wherein said third linear regulator receives an input signal and regulates said combined output to track said input signal.

Illustrated generally at 16. The power supply of 15 wherein based on a frequency component of said input signal, said second switching regulator is selectively disabled.

Illustrated generally at 17. The power supply of 15 wherein a control signal, indicative of whether said input signal is increasing in magnitude or decreasing in magnitude, provides a control to said second switching regulator to control operation of said second switching regulator.

Illustrated generally at 18. The power supply of 15 wherein said second switching regulator comprises one or more switching regulators whose outputs are combined in parallel, said one or more switching regulators each having different frequency responses and based on a frequency of said input signal only one of said one or more switching regulators is enabled.

Illustrated generally at 19. The power supply of 10 wherein said second output is coupled to said combined output through a first capacitor and said third output is coupled to said combined output through a second capacitor.

Illustrated generally at 20. A method of providing power having a wide frequency range to a load by combining outputs of two or more switching regulators wherein each of said two or more switching regulators has an optimized frequency response in a limited frequency range and wherein each of said two or more switching regulators provides most of its power in said limited frequency range.

Thus a method and apparatus for wide bandwidth, efficient power supply have been described.

Because of the high speeds and noise considerations in embodiments of the present invention (for example, power supply variations) specialized hardware is required.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

It is to be understood that in any one or more embodiments of the invention where alternative approaches or techniques are discussed that any and all such combinations as may be possible are hereby disclosed. For example, if there are five techniques discussed that are all possible, then denoting each technique as follows: A, B, C, D, E, each technique may be either present or not present with every other technique, thus yielding $2^5$ or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus while particular embodiments and applications of the present invention have been illustrated and described, it is to be understood that the invention is not limited to the precise construction and components disclosed herein. Various modifications, changes and variations which will be apparent may be made in the arrangement, operation and details of the method and apparatus of the present invention disclosed herein without departing from the spirit and scope of the invention as defined in the claims.

What is claimed is:

1. A power supply comprising:
a first switching regulator having a first output;
a second switching regulator having a second output;
wherein the first output and the second output are coupled together in parallel to provide a combined output, the combined output providing a load current and a load power;
wherein the first switching regulator has a slower response time than the second switching regulator;
wherein the second switching regulator has a first input and a second input and regulates a voltage at the combined output by sensing the voltage at the combined output and coupling the sensed voltage at the combined output to the first input and comparing it with a reference voltage at the second input;
wherein a current provided by the second switching regulator to the combined output is sensed through a current sense element;
wherein the first switching regulator has a first switching regulator input and the sensed current through the current sense element is coupled to the first switching regulator input to control the current provided by the first switching regulator to the combined output;
wherein, when the current provided by the second switching regulator to the combined output increases, the current sensed through the current sense element coupled to the first switching regulator input increases to increase the current provided by the first switching regulator to the combined output; and
wherein the increased first switching regulator current to the combined output causes a decrease in the current provided by the second switching regulator to the combined output as the voltage at the combined output is regulated from increasing by the second switching regulator.

2. The power supply of claim 1 wherein the second switching regulator response time is made faster than the first switching regulator response time by making the second switching regulator power device switch sizes smaller than the first switching regulator power device switch sizes and running the second switching regulator at a higher switching frequency than the first switching regulator.

3. The power supply of claim 1 wherein the current sense element is a resistor.

4. The power supply of claim 1 wherein the second output is coupled to the first output through a capacitor producing the combined output.

5. The power supply of claim 1 further comprising one or more additional switching regulators with different frequency responses coupled in parallel with the combined output, and wherein based on a frequency content of power to be delivered to the combined output, only the first switching regulator and only one of the one or more additional switching regulators are providing power to the combined output.

* * * * *